United States Patent
Song

(10) Patent No.: US 7,990,769 B2
(45) Date of Patent: Aug. 2, 2011

(54) METHOD OF PROGRAMMING AND SENSING MEMORY CELLS USING TRANSVERSE CHANNELS AND DEVICES EMPLOYING SAME

(75) Inventor: Ki-whan Song, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 78 days.

(21) Appl. No.: 12/547,078

(22) Filed: Aug. 25, 2009

(65) Prior Publication Data

US 2010/0054040 A1    Mar. 4, 2010

(30) Foreign Application Priority Data

Aug. 27, 2008   (KR) .................... 10-2008-0084047

(51) Int. Cl.
*G11C 16/04*   (2006.01)

(52) U.S. Cl. .......... 365/185.18; 365/185.28; 365/185.27

(58) Field of Classification Search ............. 365/185.18, 365/185.28, 185.27, 185.03, 51; 257/324, 257/E29.309, 314–316
See application file for complete search history.

(56) References Cited

U.S. PATENT DOCUMENTS 7,075,144 B2 *   7/2006   Kim ............................ 257/324
7,447,082 B2 *   11/2008  Wang et al. .............. 365/185.28

FOREIGN PATENT DOCUMENTS

| JP | 2005-051227 | | 2/2005 |
| KR | 1019990061345 | A | 7/1999 |
| KR | 1020070010923 | A | 1/2007 |

* cited by examiner

*Primary Examiner* — David Lam
(74) *Attorney, Agent, or Firm* — Myers Bigel Sibley & Sajovec, P.A.

(57) ABSTRACT

A first channel in the substrate underlying a trap gate is biased to cause trapping of holes or electrons in the trap gate and thereby program the memory device to a programmed state. A second channel in the substrate underlying the trap gate and transverse to the first channel is biased to sense the programmed state. For example, biasing a first channel in the substrate underlying the trap gate to cause trapping of holes or electrons in the trap gate and thereby program the memory device to a programmed state may include applying voltages to a first source/drain region and first gate on a first side of the trap gate and to a second source/drain region and a second gate on a second side of the trap gate, and biasing a second channel in the substrate underlying the trap gate and transverse to the first channel to sense the programmed state may include applying voltages to a third source/drain region on a third side of the trap gate and to a fourth source/drain region on a fourth side of the trap gate.

12 Claims, 8 Drawing Sheets

METHOD OF PROGRAMMING AND SENSING MEMORY CELLS USING TRANSVERSE CHANNELS AND DEVICES EMPLOYING SAME

CROSS-REFERENCE TO RELATED APPLICATIONS

This application claims the benefit of Korean Patent Application No. 10-2008-0084047, filed on Aug. 27, 2008, in the Korean Intellectual Property Office, the disclosure of which is incorporated herein by reference in its entirety.

BACKGROUND

The present inventive subject matter relates to memory devices and, more particularly, to programming and sensing in memory devices.

Semiconductor devices can be classified as volatile memory devices and non-volatile memory devices. Volatile memory devices typically lose stored data if power is not supplied. Non-volatile memory devices typically retain stored data even when power is not supplied. Thus, non-volatile memory devices are frequently used in portable memory cards, such as smart cards, and in mobile communication systems, such as mobile phones.

SUMMARY

Some embodiments of the present inventive subject matter provide methods of operating a memory device including a trap gate disposed on a substrate. A first channel in the substrate underlying the trap gate is biased to cause trapping of holes or electrons in the trap gate and thereby program the memory device to a programmed state. A second channel in the substrate underlying the trap gate and transverse to the first channel is biased to sense the programmed state. For example, biasing a first channel in the substrate underlying the trap gate to cause trapping of holes or electrons in the trap gate and thereby program the memory device to a programmed state may include applying voltages to a first source/drain region and first gate on a first side of the trap gate and to a second source/drain region and a second gate on a second side of the trap gate, and biasing a second channel in the substrate underlying the trap gate and transverse to the first channel to sense the programmed state may include applying voltages to a third source/drain region on a third side of the trap gate and to a fourth source/drain region on a fourth side of the trap gate. The first source/drain region, the first gate, the trap gate, the second gate and the second source drain region may be aligned along a first direction, and the third source/drain region, the trap gate and the fourth source/drain region may be aligned along a second direction perpendicular to the first direction.

In some embodiments, the first source/drain area and the second source/drain area are doped with high-density impurities. The first source/drain area and the second source/drain area may be in an n-well or a p-well in the substrate. The memory device may further include a low-density doping area that is doped with low-density impurities in an area between the first source/drain area and the second source/drain area. The trap gate may be disposed on the low-density doping area.

Further embodiments of the present inventive subject matter provide a memory device including a substrate, a trap gate disposed on the substrate and a control circuit configured to program the memory device to a programmed state by biasing a first channel in the substrate underlying the trap gate to cause trapping of holes or electrons in the trap gate. The control circuit is further configured to sense the programmed state by biasing a second channel in the substrate underlying the trap gate and extending transverse to the first channel. The memory device may include first source/drain region in the substrate on a first side of the trap gate, a second source/drain region in the substrate on a second side of the trap gate, a first gate on the between the first source/drain region and the trap gate, a second gate on the substrate between the second source/drain region and the trap gate, a third source/drain region in the substrate on a third side of the trap gate and a fourth source/drain region in the substrate on a fourth side of the trap gate. The control circuit may be configured to apply voltages to the first source/drain region, the first gate, the second gate and the second source/drain region to program the memory device to the programmed state and to apply voltages to the third source/drain region and the fourth source/drain region to sense the programmed state. The first source/drain region, the first gate, the trap gate, the second gate and the second source drain region may be aligned along a first direction, and the third source/drain region, the trap gate and the fourth source/drain region may be aligned along a second direction perpendicular to the first direction.

In some embodiments, the first source/drain area and the second source/drain area may be doped with high-density impurities. The first source/drain area and the second source/drain area may be in an n-well or a p-well in the substrate. The memory device may further include a low-density doping area that is doped with low-density impurities in an area between the first source/drain area and the second source/drain area. The trap gate may be disposed on the low-density doping area.

BRIEF DESCRIPTION OF THE DRAWINGS

Some embodiments of the present inventive subject matter will be more clearly understood from the following detailed description, taken in conjunction with the accompanying drawings in which.

DETAILED DESCRIPTION

Figure 1:
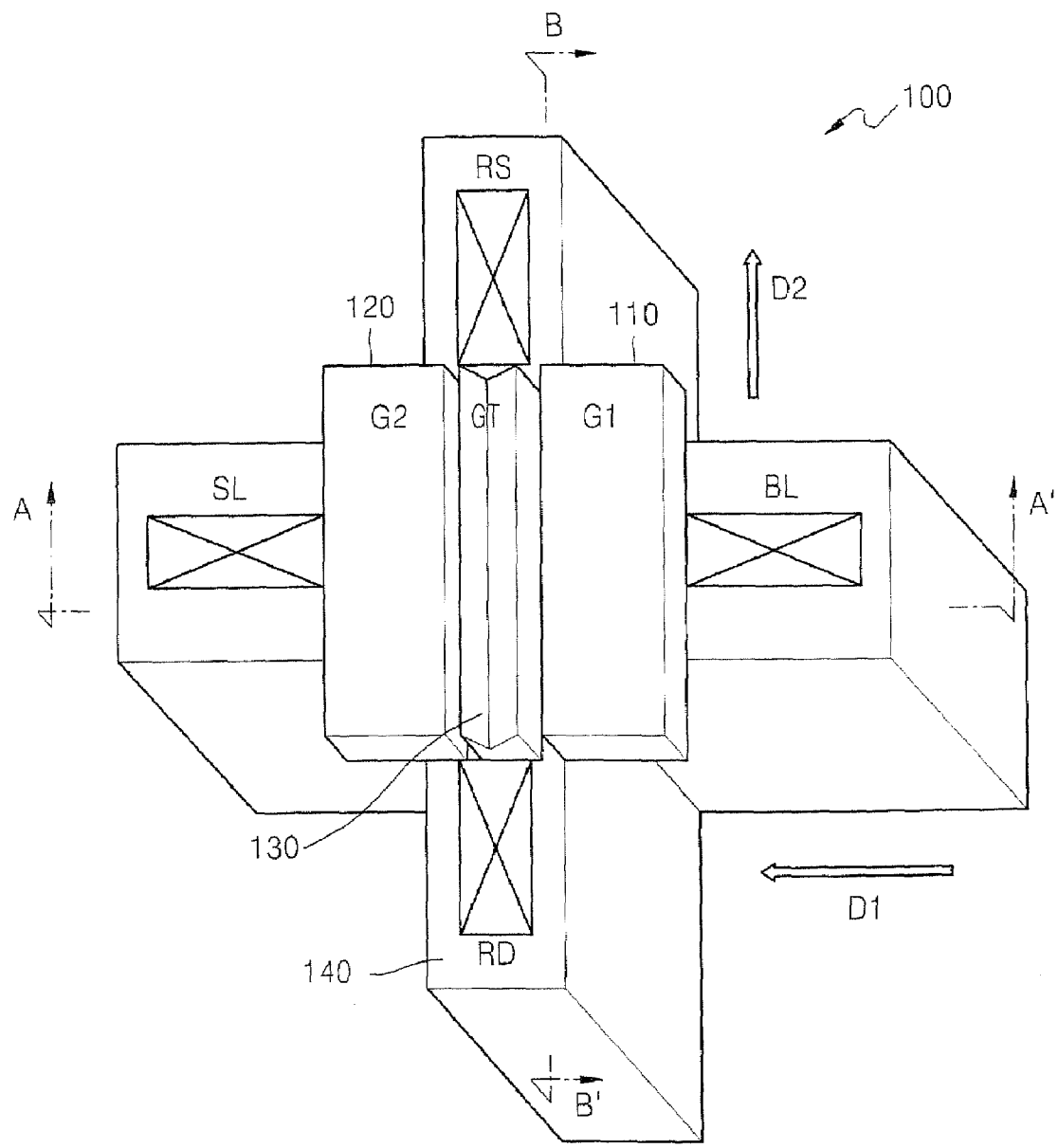
FIG. 1 is a perspective view schematically illustrating a semiconductor device according to some embodiments of the present inventive subject matter.

Embodiments of the present inventive subject matter now will be described more fully hereinafter with reference to the accompanying drawings. The present inventive subject matter may, however, be embodied in many different forms and should not be construed as limited to the embodiments set forth herein. Rather, these embodiments are provided so that this disclosure will be thorough and complete, and will fully convey the scope of the present inventive subject matter to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the present inventive subject matter. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present inventive subject matter may be described with reference to cross-sectional illustrations, which are schematic illustrations of idealized embodiments of the present inventive subject matter. As such, variations from the shapes of the illustrations, as a result, for example, of manufacturing techniques and/or tolerances, are to be expected. Thus, embodiments of the present inventive subject matter should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present inventive subject matter.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

Spatially relatively terms, such as "beneath," "below," "above," "upper," "top," "bottom" and the like, may be use d to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented (rotated 90 degrees or at other orientations) and the spatially relative descriptors used herein interpreted accordingly. As used herein, "height" refers to a direction that is generally orthogonal to the faces of a substrate.

FIG. 1 is a perspective view of a semiconductor device 100 according to some embodiments of the present inventive subject matter.

Referring to FIG. 1, the semiconductor device 100 includes a substrate 140. A first gate 110, a second gate 120, and a trap gate 130 aligned along a first direction D1 are disposed on the substrate 140. The first direction D1 is a direction along which a first node BL, the first gate 110, the trap gate 130, the second gate 120, and a second node SL are arranged on the substrate 140. Although the first direction D1 is illustrated as being from the right to the left in FIG. 1, the direction may arbitrarily defined, e.g., as being from the left to the right. A third node RD, the trap gate 130, and a fourth node RS are aligned on the substrate 140 along a second direction D2. The second direction D2 is different from the first direction D1. The second direction D2 may be perpendicular to the first direction D1 as shown, or may be at other crossing angles with respect to the first direction D1. Although the second direction D2 is illustrated as being from the bottom to the top in FIG. 1, the second direction D2 may be otherwise aligned. The trap gate 130 traps electrons or holes during a programming operation of the semiconductor device 100. The trap gate 130 may be a nitride or a floating gate.

The semiconductor device 100 may perform programming operations using a first channel underlying the trap gate 130 and extending along the first direction D1, and may perform sensing operations using a second channel underlying the trap gate and transverse (crossing) the first channel, extending along the second direction D2. The semiconductor device 100 may be, for example, a fuse, an electric fuse (eFuse), a code storage circuit, or a trimming circuit. Hereinafter, programming and sensing operations for various configurations of the semiconductor device 100 according to some embodiments of the present inventive subject matter will be described in detail.

Figure 2A:
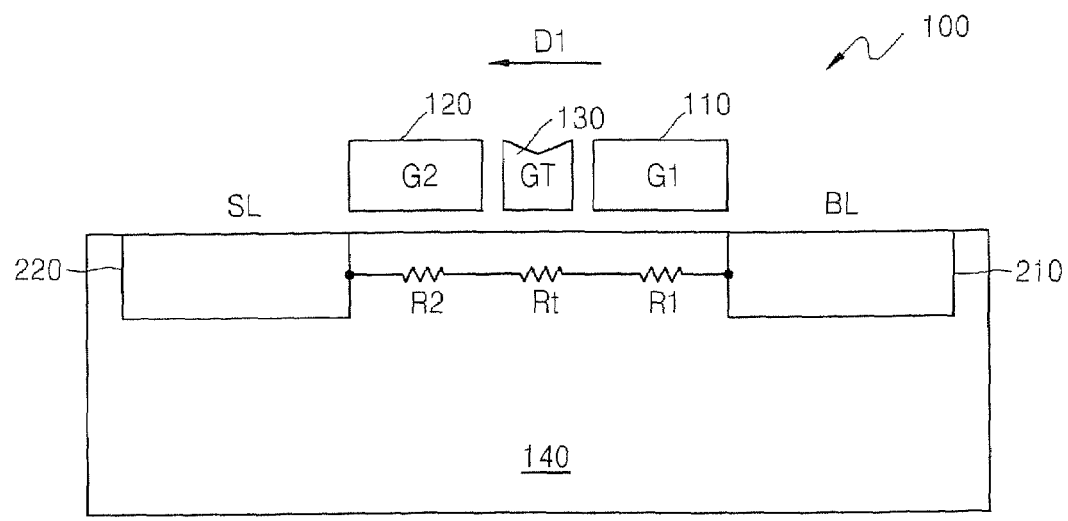
FIG. 2A is a cross-sectional view of the semiconductor device of FIG. 1, taken along a line A-A'.
Figure 2B:
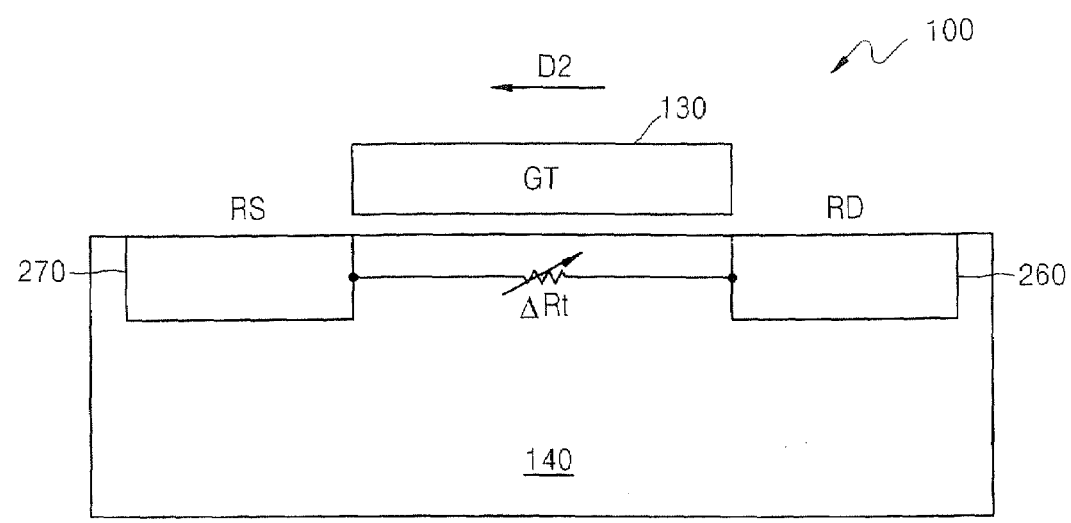
FIG. 2B is a cross-sectional view of the semiconductor device of FIG. 1, taken along a line B-B'.

FIG. 2A is a cross-sectional view of some embodiments of a semiconductor device 100' having the general structure illustrated in FIG. 1, taken along a line AA' of FIG. 1, and FIG. 2B is a cross-sectional view of these embodiments taken along a line BB'. Referring to FIGS. 1, 2A, and 2B, a first source/drain area 210, a second source/drain area 220, a third source/drain area 260, and a fourth source/drain area 270 are formed in the substrate 140. In particular, the first node BL is the first source/drain area 210 and the second node SL is the second source/drain area 220. The third node RD is the third source/drain area 260 and the fourth node RS is the fourth source/drain area 270. The first gate 110, the trap gate 130, and the second gate 120 described above are disposed above the substrate 140 between the first source/drain area 210 and the second source/drain area 220.

Equivalent resistances R1, R2, and Rt illustrated in FIG. 2A are equivalent resistances of the first gate 110, the second gate 120, and the trap gate 130, respectively. A variable resistance ΔRt illustrated in FIG. 2B is a variable resistance of the trap gate 130. In conventional semiconductor memory devices not having the structure illustrated in FIGS. 1, 2A and 2B, both programming and sensing operations would be performed in the same direction. As a result, the semiconductor memory device may not be sensitive to the variable resistance of a trap gate. However, according to some embodiments of the present inventive subject matter, programming may be performed in a first direction D1 and sensing may be performed in a second direction D2. Thus, the semiconductor device 100' according to some embodiments of the present inventive subject matter may be sensitive to the variable resistance of the trap gate 130. In particular, while sensitivity may be modeled as ΔRt/(R1+R2+Rt) in the conventional art, sensitivity in operations according to the some embodiments of the present inventive subject matter may be modeled ΔRt/Rt and, thus, the semiconductor device 100 can react to the variable resistance more sensitively than in the conventional art.

Figure 3A:
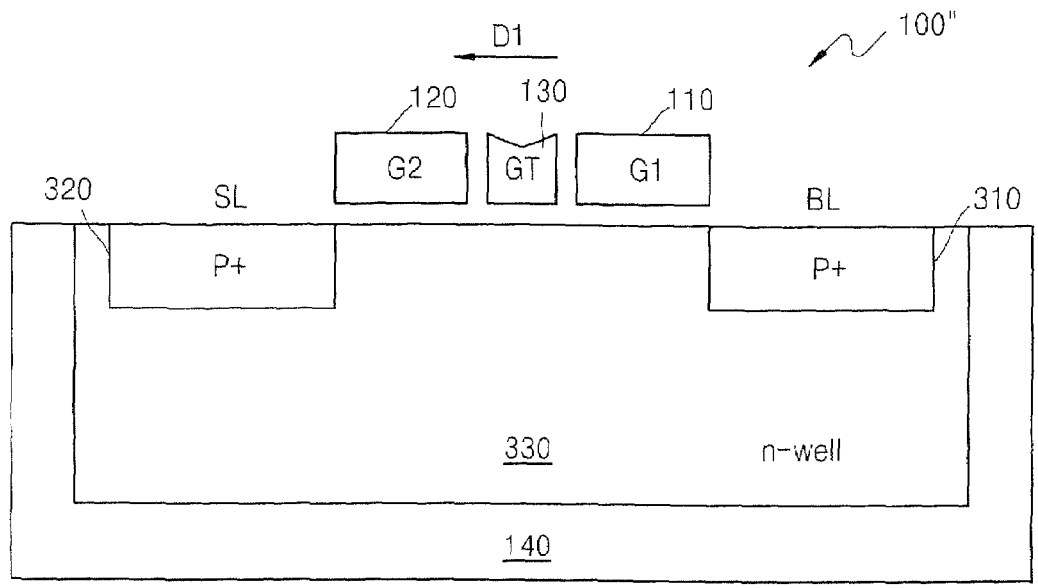
FIG. 3A is a cross-sectional view of the semiconductor device of FIG. 1 according to further embodiments of the present inventive subject matter.

FIG. 3A is a cross-sectional view of a semiconductor device 100" along the line AA' of FIG. 1 according to further embodiments of the present inventive subject matter. Referring to FIGS. 1 and 3A, an n-well 330 is formed in the substrate 140, and areas doped with high-density p-type impurities (p+) are formed in the n-well 330. A first source/drain area 310 and a second source/drain area 320 are doped with the high-density p-type impurities (p+).

Figure 3B:
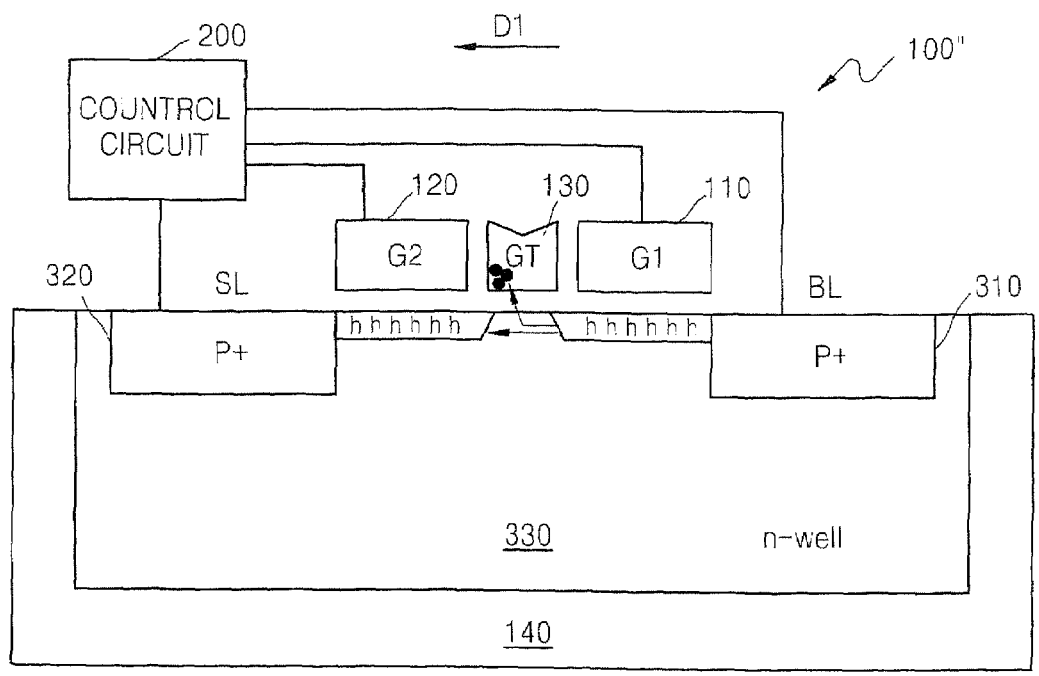
FIG. 3B is a cross-sectional view illustrating programming operations of the semiconductor device of FIG. 3A according to further embodiments of the present inventive subject matter.
Figure 3C:
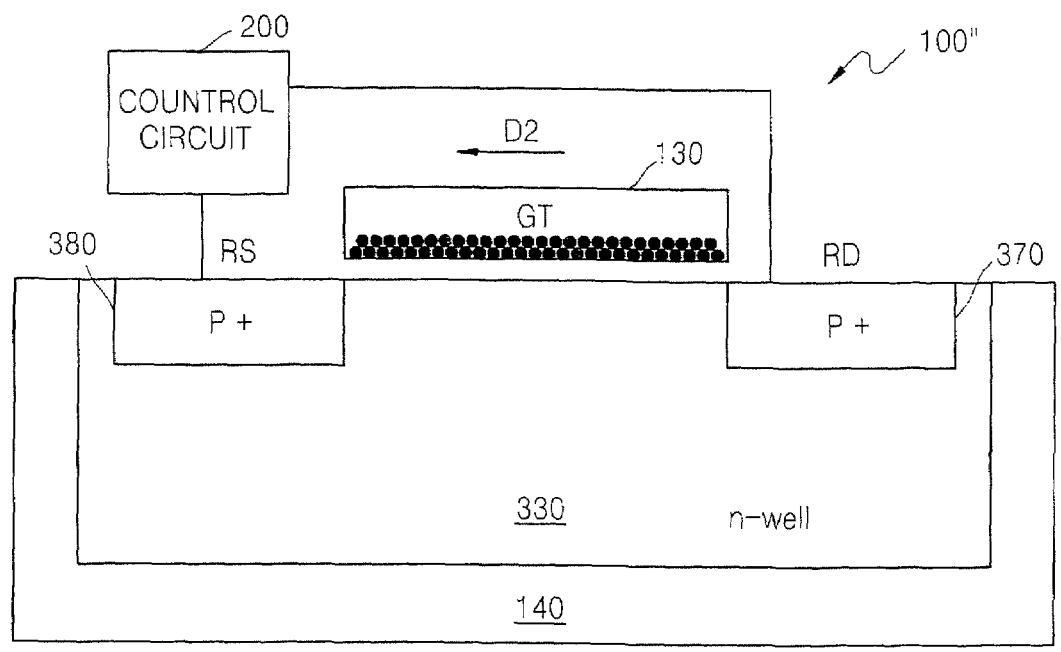
FIG. 3C is a cross-sectional view illustrating sensing operations of the semiconductor device of FIG. 3A according to further embodiments of the present inventive subject matter.

FIG. 3B is a cross-sectional view illustrating programming operations for the semiconductor device 100" of FIG. 3A taken along a line AA' of FIG. 1, and FIG. 3C is a cross-sectional view illustrating sensing operations of the semiconductor device 100" of FIG. 3A, taken along a line BB' of FIG. 1. Hereinafter, programming and sensing operations for the semiconductor device 100" will be described with reference to FIGS. 3B and 3C.

In order to program the device 100", a control circuit 200 applies predetermined voltages to the first source/drain area 310, the first gate 110, the second gate 120, and the second source/drain area 320. For example, 0 V may be applied to the first source/drain area 310, −0.5 V may be applied to the first gate 110, −7 V may be applied to the second gate 120, and −6 V may be applied to the second source/drain area 320. In this case, the spaces between the first source/drain area 310 and the first gate 110 and between the second gate 120 and the second source/drain area 320 are turned on slightly, and a channel is formed between the first source/drain area 310 and the second source/drain area 320. A strong electric field is formed between the first source/drain area 310 and the second source/drain area 320, and while holes h of the channel move from the first source/drain area 310 to the second source/drain area 320, the holes h are trapped in the trap gate 130 by hot-hole injection.

After programming, the holes h are trapped in the trap gate 130 as illustrated in FIG. 3C. Sensing may be performed by the control circuit 200 applying 0 V to a third source/drain area 370 and 1 V to a fourth source/drain area 380.

Figure 4A:
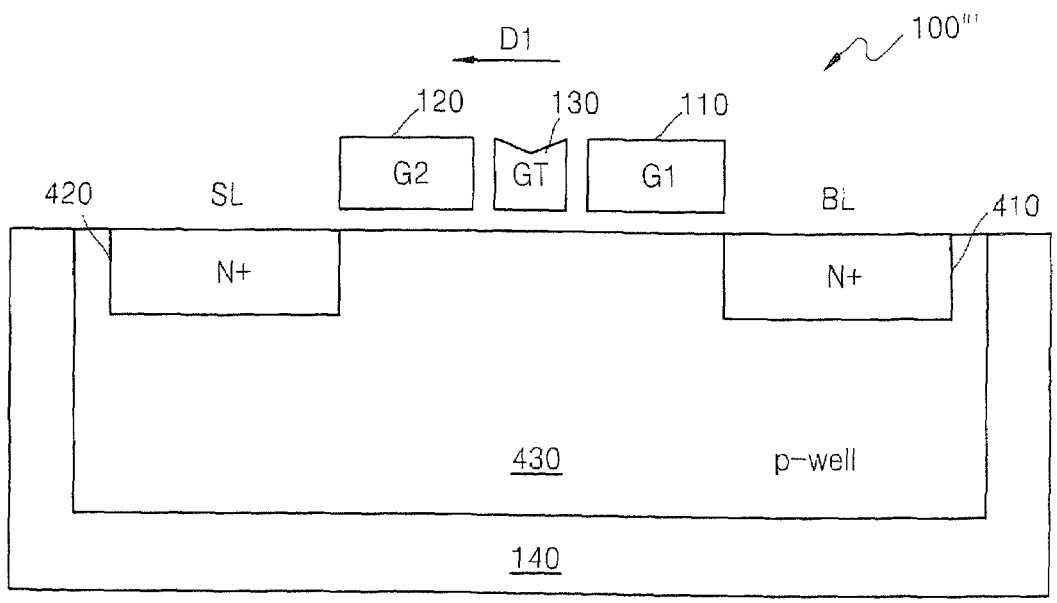
FIG. 4A is a cross-sectional view of the semiconductor device of FIG. 1 according to further embodiments of the present inventive subject matter.

FIG. 4A is a cross-sectional view of a semiconductor device 100''' along line AA' of FIG. 1 according to further embodiments of the present inventive subject matter. Referring to FIGS. 1 and 4A, a p-well 430 is formed in the substrate 140, and areas doped with high-density n-type impurities (n+) are formed in the p-well 430. A first source/drain area 410 and a second source/drain area 420 are doped with the high-density n-type impurities (n+).

Figure 4B:
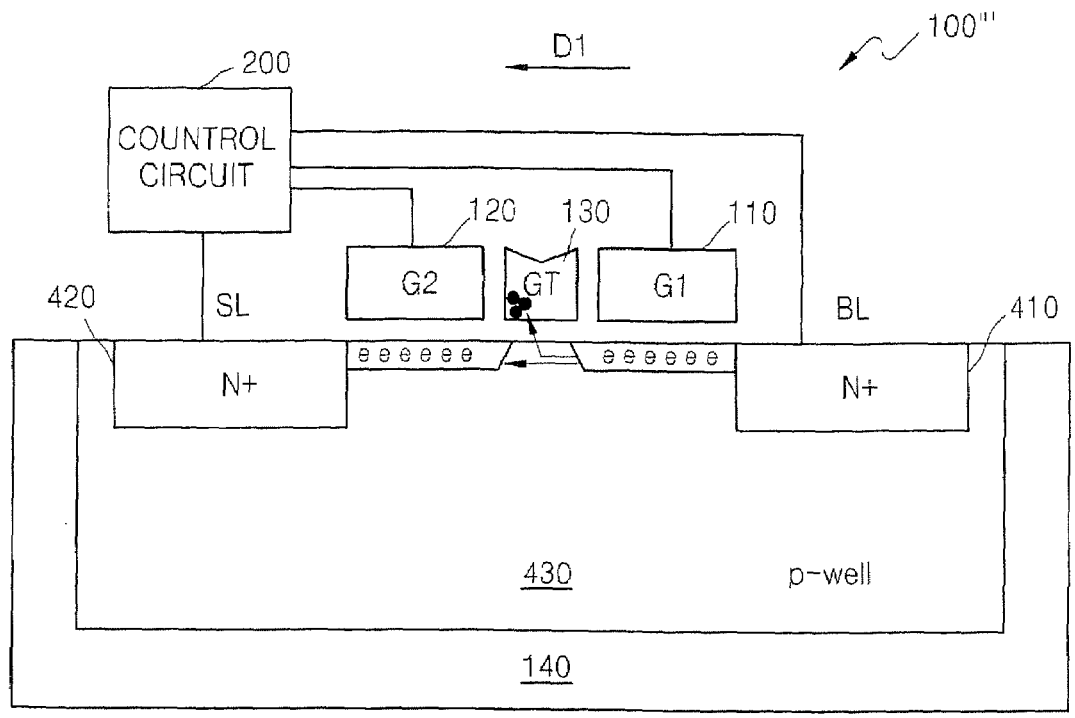
FIG. 4B is a cross-sectional view illustrating programming operations of the semiconductor device of FIG. 4A according to further embodiments of the present inventive subject matter.
Figure 4C:
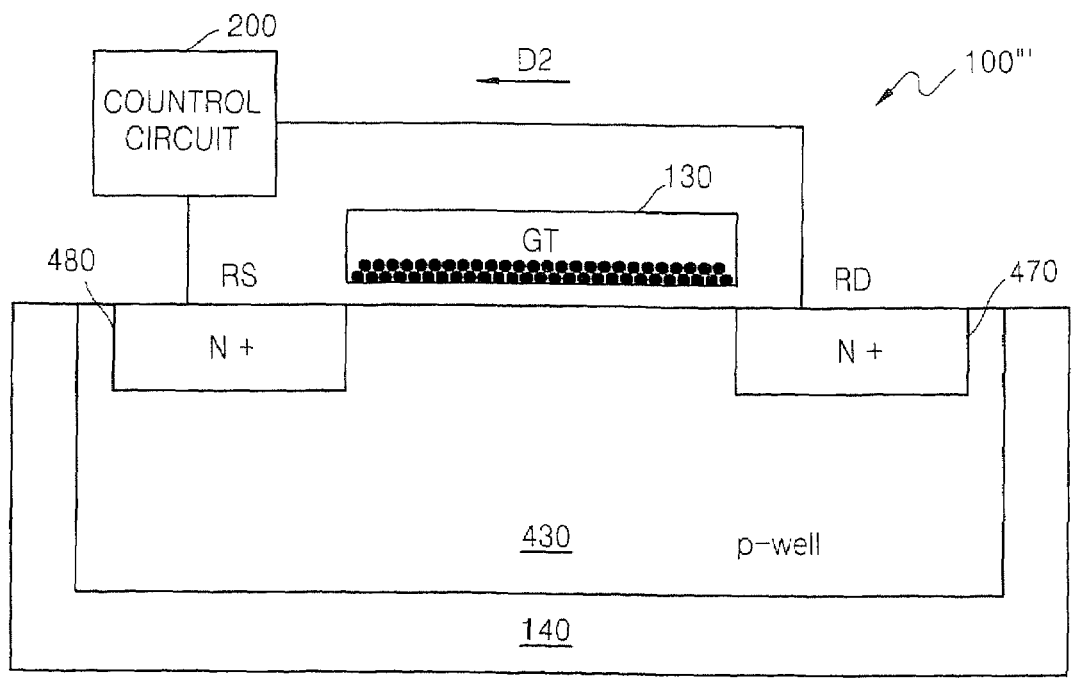
FIG. 4C illustrates sensing operations of the semiconductor device of FIG. 4A according to further embodiments of the present inventive subject matter.

FIG. 4B is a cross-sectional view illustrating programming operations for the semiconductor device 100''' of FIG. 4A taken along a line AA' of FIG. 1, and FIG. 4C is a cross-sectional view illustrating sensing operations of the semiconductor device 100''' of FIG. 4A taken along a line BB' of FIG. 1. Hereinafter, programming and sensing operations of the semiconductor device 100''' will be described with reference to FIGS. 4B and 4C.

In order to program the device 100''', a control circuit 200 applies predetermined voltages to the first source/drain area 410, the first gate 110, the second gate 120, and the second source/drain area 420. For example, 0 V may be applied to the first source/drain area 410, −0.5 V may be applied to the first gate 110, 5 V may be applied to the second gate 120, and 4 V may be applied to the second source/drain area 420. In this case, the spaces between the first source/drain area 410 and the first gate 110 and between the second gate 120 and the second source/drain area 420 are turned on slightly, and a channel is formed between the first source/drain area 410 and the second source/drain area 420. A strong electric field is formed between the first source/drain area 410 and the second source/drain area 420, and while electrons e of the channel move from the first source/drain area 410 to the second source/drain area 420, the electrons e are trapped in the trap gate 130 by hot-hole injection.

After the programming operation is performed, the electrons e are trapped in the trap gate 130 as illustrated in FIG. 4C. Sensing may be performed by the control circuit 200 applying 0 V to a third source/drain area 470 and −1 V to a fourth source/drain area 480.

Figure 5A:
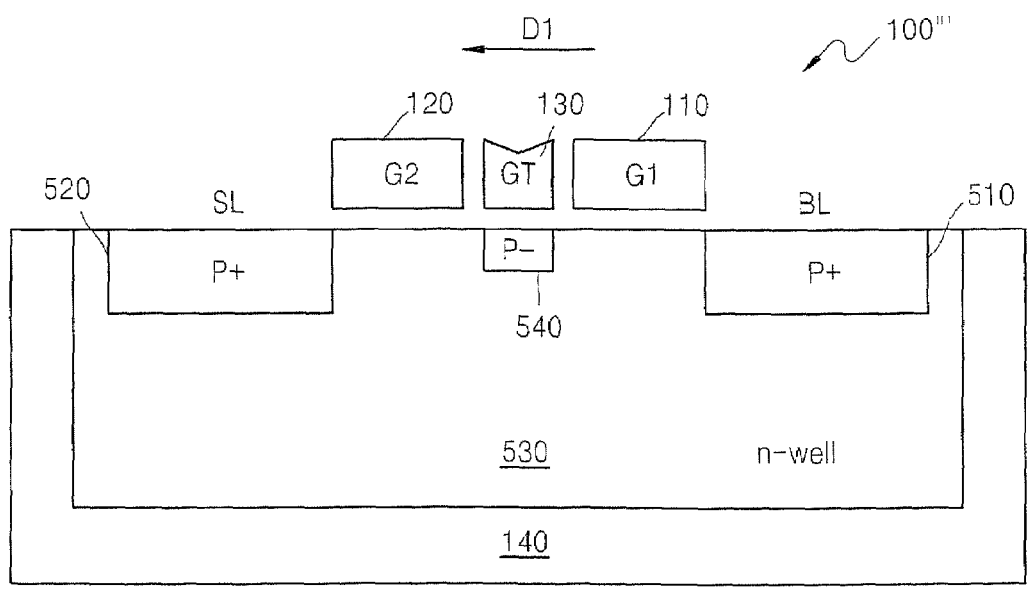
FIG. 5A is a cross-sectional view of the semiconductor device of FIG. 1 according to further embodiments of the present inventive subject matter.

FIG. 5A is a cross-sectional view illustrating a semiconductor device 100'''' along the line AA' of FIG. 1 according to further embodiments of the present inventive subject matter. Referring to FIGS. 1 and 5A, an n-well 530 is formed in the substrate 140 (not shown), and areas doped with high-density p-type impurities (p+) and an area 540 doped with low-density p-type impurities (p−) are formed in the n-well 530. That is, a first source/drain area 510 and a second source/drain area 520 are doped with the high-density p-type impurities (p+). The area 540 is formed between the first source/drain area 510 and the second source/drain area 520, and the trap gate 130 is disposed over the area 540.

Figure 5B:
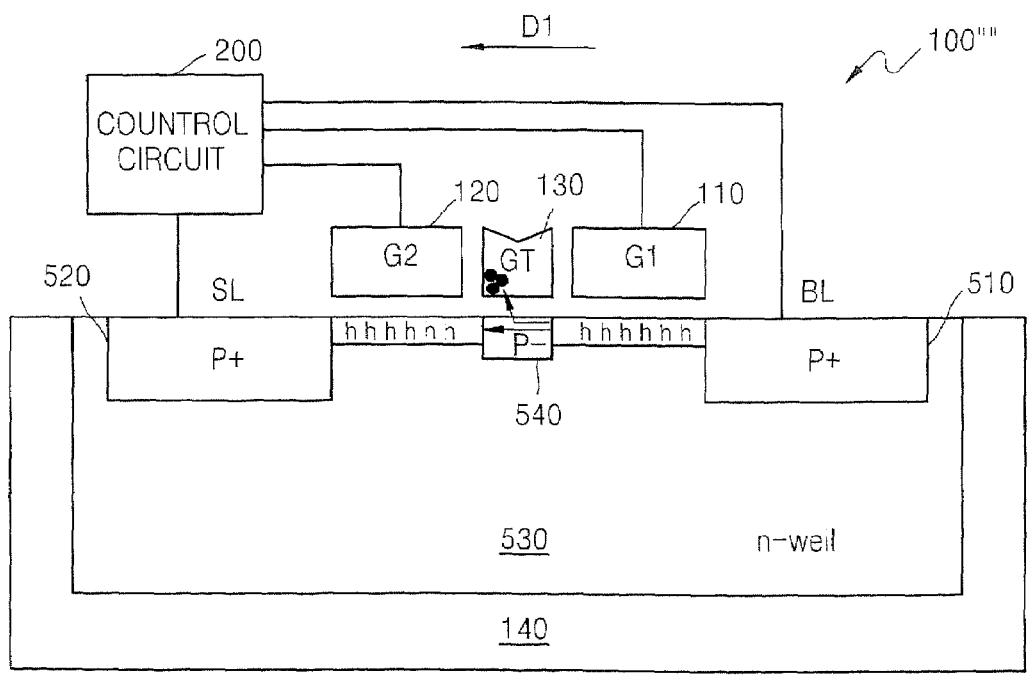
FIG. 5B is a cross-sectional view illustrating programming operations of the semiconductor device of FIG. 5A according to further embodiments of the present inventive subject matter.
Figure 5C:
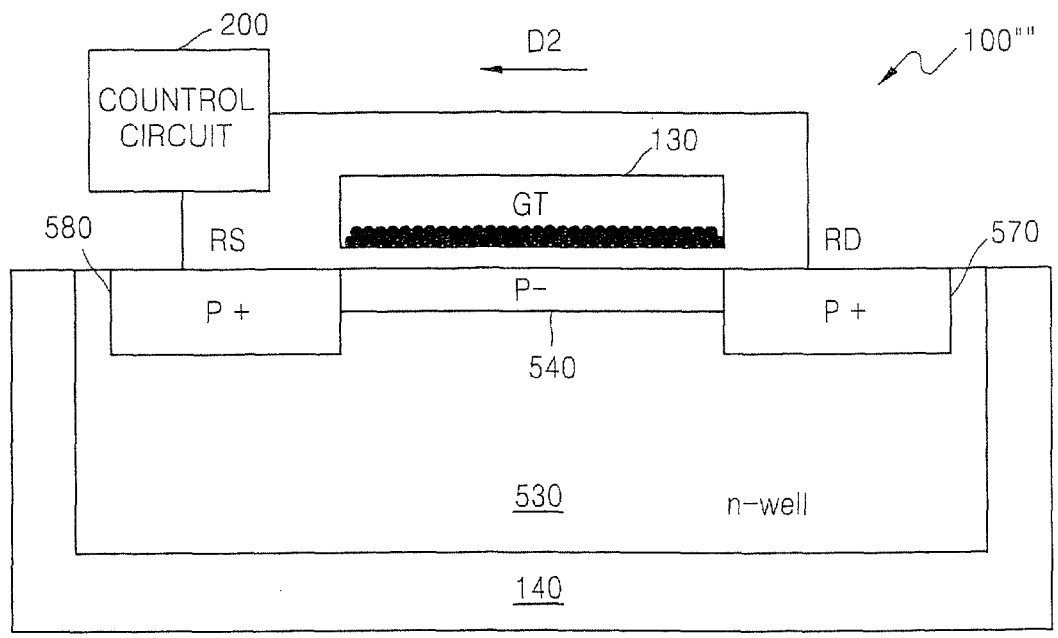
FIG. 5C is a cross-sectional view illustrating sensing operations of the semiconductor device of FIG. 5A according to further embodiments of the present inventive subject matter.

FIG. 5B is a cross-sectional view along the line AA' of FIG. 1 illustrating programming operations for the semiconductor device 100'''' of FIG. 5A, and FIG. 5C is a cross-sectional view along the line BB' of FIG. 1 illustrating sensing operations for the semiconductor device 100'''' of FIG. 5A. The programming operations for the semiconductor device 100'''' are performed in a similar manner to the programming operations for the semiconductor device 100'' of FIG. 3B, and the sensing operations for the semiconductor device 100'''' of FIG. 5C are performed in a similar manner to the sensing operations for the semiconductor device 100'' of FIG. 3C. In particular, in order to programming the device 100'''', a control circuit 200 applies predetermined voltages to the first source/drain area 510, the first gate 110, the second gate 120, and the second source/drain area 520. As described with reference to the embodiments of FIG. 3B, the control circuit 200 may apply 0 V to the first source/drain area 510, −0.5 V to the first gate 110, −7 V to the second gate 120, and −6 V to the second source/drain area 520. In this case, the spaces between the first source/drain area 510 and the first gate 110 and between the second gate 120 and the second source/drain area 520 are turned on slightly, and a channel is formed between the first source/drain area 510 and the area 540 and between the 540 and the second source/drain area 520. A strong electric field is formed between the first source/drain area 510 and the second source/drain area 520, and while holes h of the channel move from the first source/drain area 510 to the second source/drain area 520, the holes h are trapped in the trap gate 130 by hot-hole injection.

After programming, the holes h are trapped in the trap gate 130 as illustrated in FIG. 5C. Sensing may be performed by the control circuit 200 applying 0 V to a third source/drain area 570 and 1 V to a fourth source/drain area 580.

Figure 6A:
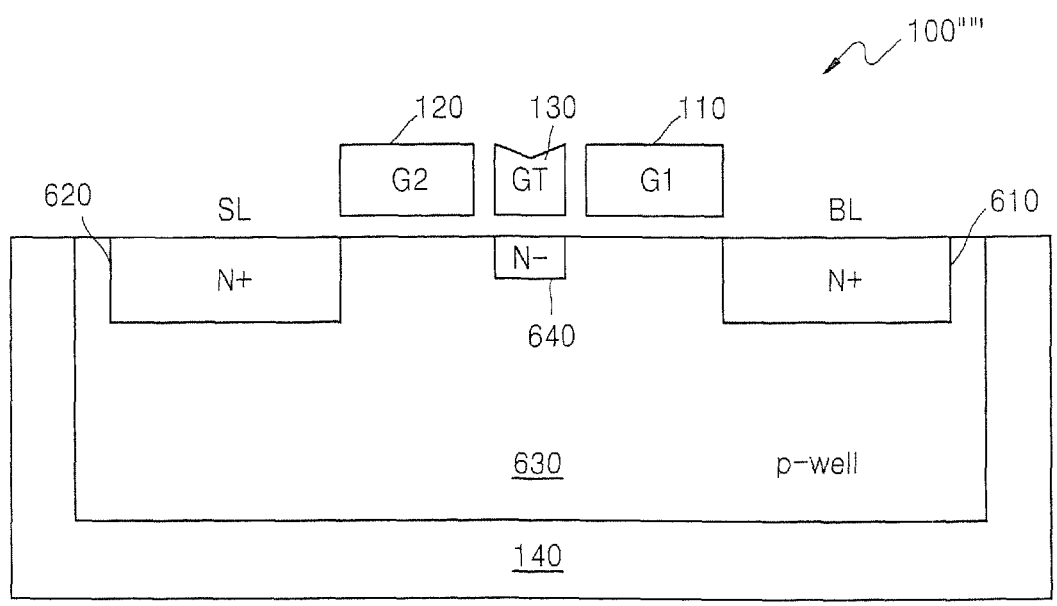
FIG. 6A is a cross-sectional view of the semiconductor device of FIG. 1 according to further embodiments of the present inventive subject matter.

FIG. 6A is a cross-sectional view of a semiconductor device 100''''' taken along the line AA' of FIG. 1 according to further embodiments of the present inventive subject matter. Referring to FIGS. 1 and 6A, a p-well 630 is formed in the substrate 140, and areas doped with high-density n-type impurities (n+) and an area 640 doped with low-density n-type impurities (n−) are formed in the p-well 630. A first source/drain area 610 and a second source/drain area 620 are doped with the high-density n-type impurities (n+). The area 640 is formed between the first source/drain area 610 and the second source/drain area 620, and the trap gate 130 is disposed over the low-density doping area 640.

Figure 6B:
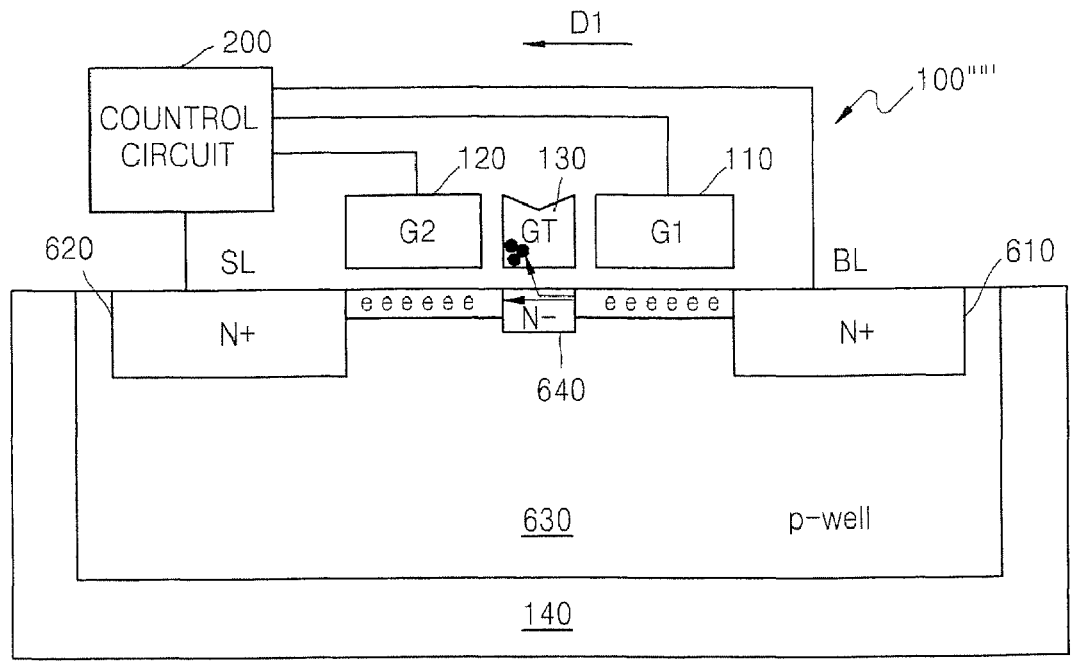
FIG. 6B is a cross-sectional view illustrating programming operations of the semiconductor device of FIG. 6A according to further embodiments of the present inventive subject matter.
Figure 6C:
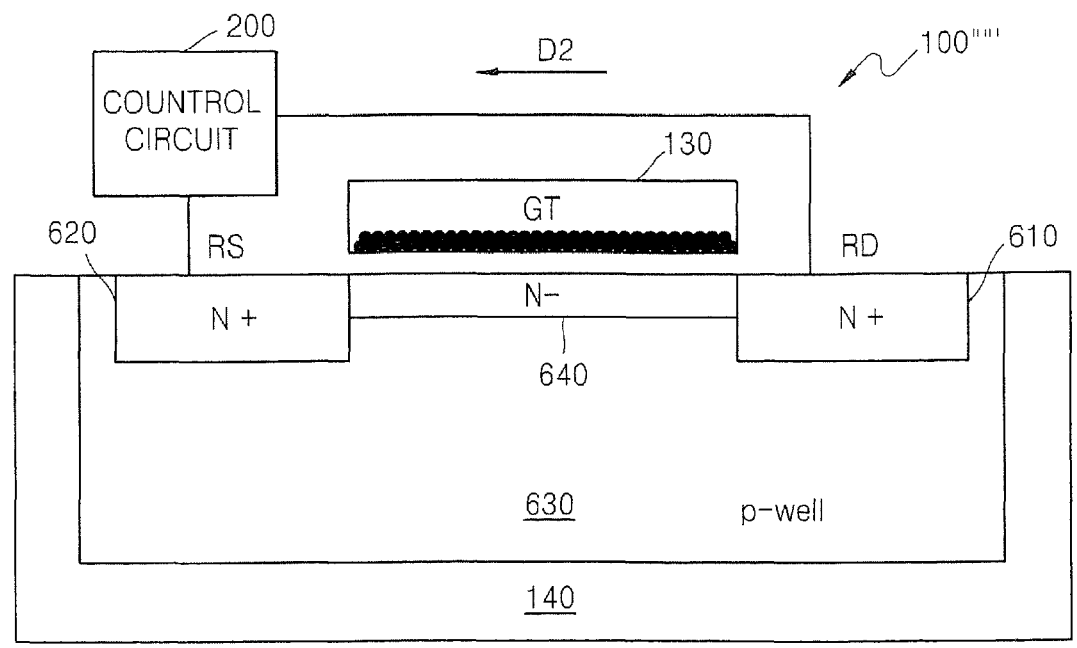
FIG. 6C is a cross-sectional view illustrating sensing operations of the semiconductor device of FIG. 6A according to further embodiments of the present inventive subject matter.

FIG. 6B is a cross-sectional view along the line AA' of FIG. 1 illustrating programming operations for the semiconductor device 100 of FIG. 6A, and FIG. 6C is a cross-sectional view along the line BB' of FIG. 1 illustrating sensing operations for the semiconductor device 100''''' of FIG. 6A. The programming operations for the semiconductor device 100''''' of FIG. 6B may be performed in a similar manner to the programming operations for the semiconductor device 100''' of FIG. 4B, and the sensing operations for the semiconductor device 100''''' of FIG. 6C may be performed in a similar manner to the sensing operations for the semiconductor device 100''' of FIG. 4C. For example, to program the device 100''''', a control circuit 200 may apply predetermined voltages to the first source/drain area 610, the first gate 110, the second gate 120, and the second source/drain area 620. As described with reference to the embodiment of FIG. 4B, for example, 0 V may be applied to the first source/drain area 610, 0.5 V may be applied to the first gate 110, 5 V may be applied to the second gate 120, and 4 V may be applied to the second source/drain area 620. In this case, the spaces between the first source/drain area 610 and the first gate 110 and between the second gate 120 and the second source/drain area 620 are turned on slightly, and a channel is formed between the first source/drain area 610 and the area 640 and between the area 640 and the second source/drain area 620. A strong electric field is formed between the first source/drain area 610 and the second source/drain area 620, and while electrons e of the channel move from the first source/drain area 610 to the second source/drain area 620, the electrons e are trapped in the trap gate 130 by hot-hole injection.

After programming, the electrons e remain trapped in the trap gate 130 as illustrated in FIG. 6C. Sensing may be performed by the control circuit 200 applying 0 V to a third source/drain area 670 and 1V to a fourth source/drain area 680.

While the present inventive subject matter has been particularly shown and described with reference to exemplary embodiments thereof, it will be understood by those of ordinary skill in the art that various changes in form and detail may be made therein without departing from the spirit and scope of the present inventive subject matter as defined by the following claims. The exemplary embodiments should be considered in a descriptive sense only and not for purposes of limitation.

What is claimed is:

1. A method of operating a memory device comprising a trap gate disposed on a substrate, the method comprising:
    biasing a first channel in the substrate underlying the trap gate to cause trapping of holes or electrons in the trap gate and thereby program the memory device to a programmed state by applying voltages to a first source/drain region and first gate on a first side of the trap gate and to a second source/drain region and a second gate disposed on a second side of the trap gate; and
    biasing a second channel in the substrate underlying the trap gate and transverse to the first channel to sense the programmed state by applying voltages to a third source/drain region on a third side of the trap gate and to a fourth source/drain region on a fourth side of the trap gate.

2. The method of claim 1, wherein the first source/drain area and the second source/drain area are doped with high-density impurities.

3. The method of claim 2, wherein the first source/drain area and the second source/drain area are in an n-well or a p-well in the substrate.

4. The method of claim 3, wherein the memory device further comprises a low-density doping area that is doped with low-density impurities in an area between the first source/drain area and the second source/drain area.

5. The method of claim 4, wherein the trap gate is disposed on the low-density doping area.

6. The method of claim 1, wherein the first source/drain region, the first gate, the trap gate, the second gate and the second source drain region are aligned along a first direction, and wherein the third source/drain region, the trap gate and the fourth source/drain region are aligned along a second direction perpendicular to the first direction.

7. A memory device comprising:
    a substrate;
    a trap gate disposed on the substrate;
    a first source/drain region in the substrate on a first side of the trap gate;
    a second source/drain region in the substrate on a second side of the trap gate;
    a first gate on the substrate between the first source/drain region and the trap gate;
    a second gate on the substrate between the second source/drain region and the trap gate;

a third source/drain region in the substrate on a third side of the trap gate;

a fourth source/drain region in the substrate on a fourth side of the trap gate; and a control circuit configured to program the memory device to a programmed state by biasing a first channel in the substrate underlying the trap gate to cause trapping of holes or electrons in the trap gate by applying voltages to the first source/drain region, the first gate, the second gate and the second source/drain region and to sense the programmed state by biasing a second channel in the substrate underlying the trap gate and extending transverse to the first channel by applying voltages to the third source/drain region and the fourth source/drain region.

8. The memory device of claim 7, wherein the first source/drain area and the second source/drain area are doped with high-density impurities.

9. The memory device of claim 7, wherein the first source/drain area and the second source/drain area are in an n-well or a p-well in the substrate.

10. The memory device of claim 7, wherein the memory device further comprises a low-density doping area that is doped with low-density impurities in an area between the first source/drain area and the second source/drain area.

11. The memory device of claim 10, wherein the trap gate is disposed on the low-density doping area.

12. The memory device of claim 7, wherein the first source/drain region, the first gate, the trap gate, the second gate and the second source drain region are aligned along a first direction, and wherein the third source/drain region, the trap gate and the fourth source/drain region are aligned along a second direction perpendicular to the first direction.

* * * * *